US007834276B2

United States Patent
Chou et al.

(10) Patent No.: US 7,834,276 B2
(45) Date of Patent: Nov. 16, 2010

(54) STRUCTURE FOR CONNECTING A USB COMMUNICATION INTERFACE IN A FLASH MEMORY CARD BY THE HEIGHT DIFFERENCE OF A RIGID FLEXIBLE BOARD

(75) Inventors: Cheng Hsien Chou, Taipei (TW); Yu-Jen Chen, Taipei (TW); Kai Hsiang Chiang, Taipei (TW); Chia Hurg Ting, Taipei (TW)

(73) Assignee: Unitech Printed Circuit Board Corp., Taipei (TW)

( * ) Notice: Subject to any disclaimer, the term of this patent is extended or adjusted under 35 U.S.C. 154(b) by 142 days.

(21) Appl. No.: 11/304,665

(22) Filed: Dec. 16, 2005

(65) Prior Publication Data

US 2007/0162698 A1    Jul. 12, 2007

(51) Int. Cl.
G06F 3/00 (2006.01)
G06F 13/12 (2006.01)
G06F 1/16 (2006.01)
H05K 7/10 (2006.01)
H05K 7/20 (2006.01)
H01L 21/00 (2006.01)
H01R 12/04 (2006.01)

(52) U.S. Cl. .............................. 174/262; 710/2; 710/62; 710/301; 361/679.31; 361/679.32; 361/679.38; 361/679.39; 361/721; 361/749; 361/760; 361/784; 430/314; 174/261

(58) Field of Classification Search .................. None
See application file for complete search history.

(56) References Cited

U.S. PATENT DOCUMENTS

| 4,509,095 | A * | 4/1985 | Boros .......................... 361/721 |
| 5,499,444 | A * | 3/1996 | Doane et al. .................. 29/830 |
| 6,183,307 | B1 * | 2/2001 | Laity et al. .................. 439/676 |
| 6,350,387 | B2 * | 2/2002 | Caron et al. ................. 430/314 |
| 6,678,167 | B1 * | 1/2004 | Degani et al. ............... 361/760 |
| 6,784,375 | B2 * | 8/2004 | Miyake et al. .............. 174/261 |
| 6,894,901 | B2 * | 5/2005 | Simon ......................... 361/707 |
| 7,075,794 | B2 * | 7/2006 | Gall et al. ................... 361/749 |

(Continued)

OTHER PUBLICATIONS

"Inovix Markets New Hybrid SD/USB Cards." NetMediaEurope Spain. Dec. 15, 2005. Feb. 12, 2010. <http://www.itespresso.es/articles/printView/es/news/2005/12/15/20051215001>.*

(Continued)

Primary Examiner—Tariq R. Hafiz
Assistant Examiner—Henry Yu
(74) Attorney, Agent, or Firm—Muncy, Geissler, Olds & Lowe, PLLC

(57) ABSTRACT

The present invention relates to a flash memory card that is a structure using a rigid flexible board (RFB) to connect a flash memory card unit and a universal serial bus (USB) unit. A communication interface in compliance with the specification of the flash memory card is disposed at one end of the flash memory card, and a USB communication interface is disposed at another end, and a rigid flexible board is provided for connecting the electric signals between the two communication interfaces and the bending characteristic is used to maintain the height difference between the planes of the two communication interface, so that the flash memory card can concurrently have the USB communication interface and enhance the applicability of the flash memory card.

8 Claims, 6 Drawing Sheets

U.S. PATENT DOCUMENTS

2005/0018972 A1* 1/2005 Anderson et al. ............. 385/53
2005/0162840 A1* 7/2005 Morita ....................... 361/784
2005/0182858 A1* 8/2005 Lo et al. ........................ 710/1
2006/0083158 A1* 4/2006 Lee ............................ 370/208
2006/0288145 A1* 12/2006 Chen .......................... 710/301

OTHER PUBLICATIONS

"Welcome to INOVIX Technology." INOVIX. Apr. 2, 2006. Feb. 12, 2010. <http://web.archive.org/web/20060615032702/inovixproducts.com/products/index.php?l.*

* cited by examiner

STRUCTURE FOR CONNECTING A USB COMMUNICATION INTERFACE IN A FLASH MEMORY CARD BY THE HEIGHT DIFFERENCE OF A RIGID FLEXIBLE BOARD

BACKGROUND OF THE INVENTION

1. Field of the Invention

The present invention relates to a structure of connecting a flash memory card specification unit with a USB unit in a flash memory card by a rigid flexible board, and more particularly to a flash memory card having a communication interface in compliance with the specification of the flash memory card disposed at one end and a communication interface in compliance with the specification of a universal serial bus (USB) on the other end, and electric signals between the two communication interfaces are connected by a rigid flexible board (RFB), and a specific height difference is maintained between the planes of the two communication interfaces.

2. Description of the Related Art

Flash memory is a non-volatile memory having the advantage of retaining data after the power is turned off, and also possessing the advantages of a volatile memory that can be read and written repeatedly, and comes with a high capacity (quantity data stored in unit volume). The flash memory can be built in an electronic device, or expanded for larger memory size, and thus the flash memories are packaged according to different specifications. In other words, the flash memory cards include Compact Flash (CF) card, Smart Media (SM) card, Multi Media Card (MMC), Memory Stick (MS), and Secure Digital (SD) card, etc.

In the meantime, the practical applications of the flash memory card covers the areas of mobile phones, flash memory sticks, MP3 players, and digital personal assistants (PDA), etc. Since there are various different specifications, the flash memory cards come with different lengths, widths, and communication interfaces (pins); for example, the Compact Flash (CF) card has 50 pins for its communication interface, the Smart Media (SM) card has 22 pins for its communication interface, the Memory Stick (MS) card has 10 pins for its communication interface, and the Secure Digital (SD) card has 9 pins for its communication interface. Although there are 6-in-1 and all-in-one card readers in the market, the design of these card readers must have several card slots and interface contact points according to various different formats of the flash memory cards. The more the specifications of the memory cards, the more complicated are the designs, and thus the higher is the cost of the card readers.

Refer to FIGS. 6 and 6a for the improvements of the foregoing shortcomings and the integration of a popular memory card such as a Secure Digital (SD) card having a higher capacity and a smaller volume with a popular common Universal Serial Bus (USB) communication interface, in hopes of allowing the Secure Digital (SD) card to concurrently have two kinds of communication interfaces. Since the heights of the SD communication interface of the SD card and the USB communication interface are different, the USB communication interface is bent upward to overcome the height difference between these two communication interfaces to match with the USB connector. On a rigid printed circuit board 70, the SD communication interface 80 and USB communication interface 60 are soldered, and a 90-degree continuous bending is formed at the USB communication interface 60 and extended outward (as shown in FIG. 6a) to solve the problem of having a height difference between the SD communication interface 80 and the USB communication interface 60. However, the external plugging and unplugging forces are exerted directly onto these communication interfaces, the communication interfaces will be cracked or broken at the bent position very easily after the communication interfaces have been used for a while, so that the USB communication interface 60 will be short-circuit and unable to transmit information.

SUMMARY OF THE INVENTION

Therefore, it is a primary objective of the present invention to overcome the foregoing shortcomings of the prior art and cope with the difference between the flash memory card and the USB communication interface by using the flexible, light and thin, and spatial wiring characteristics of a rigid flexible board (RFB) for electrically connecting the circuit of the USB communication interface, so as to solve the problems of having a height difference between the two communication interfaces.

DETAILED DESCRIPTION OF THE PREFERRED EMBODIMENTS

Figure 1:
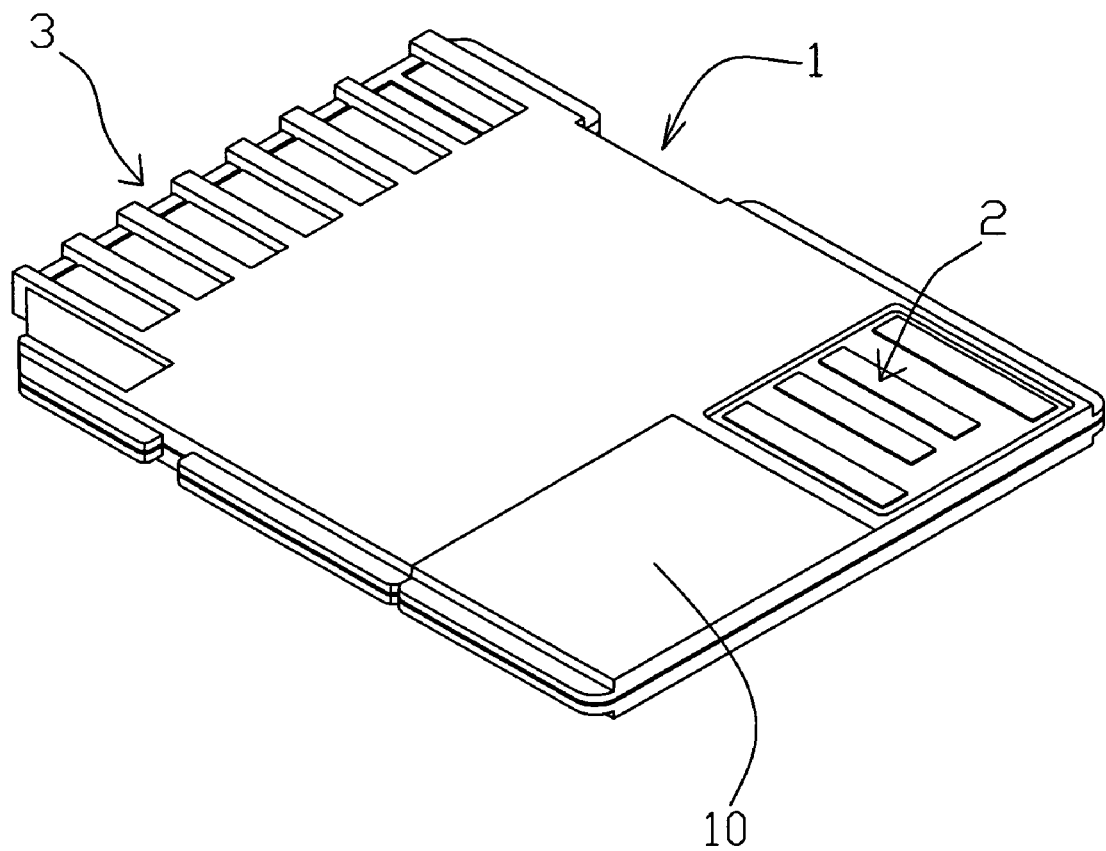
FIG. 1 is a perspective view of the invention.
Figure 2:
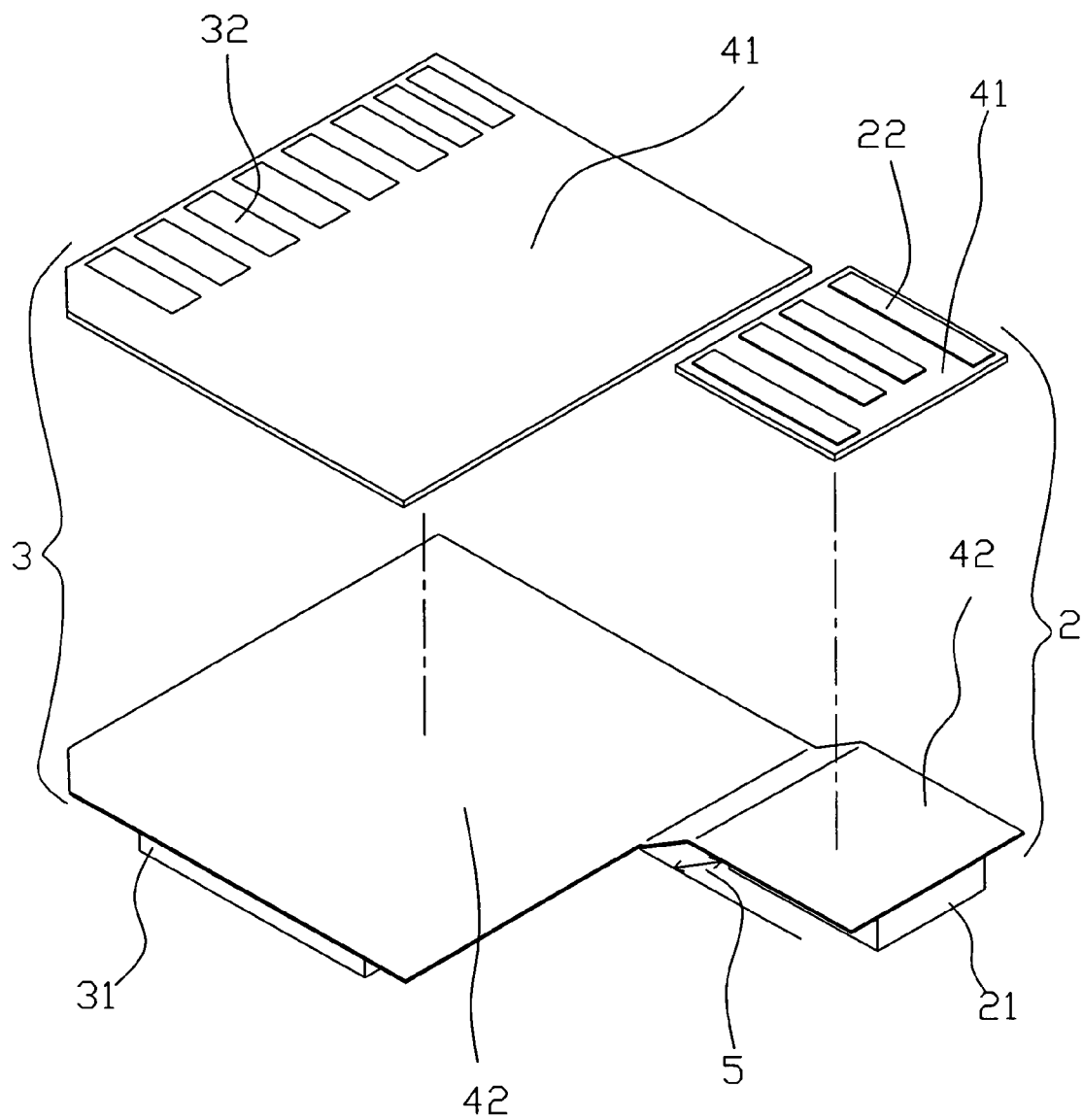
FIG. 2 is an exploded view of the internal structure of the invention.
Figure 3:
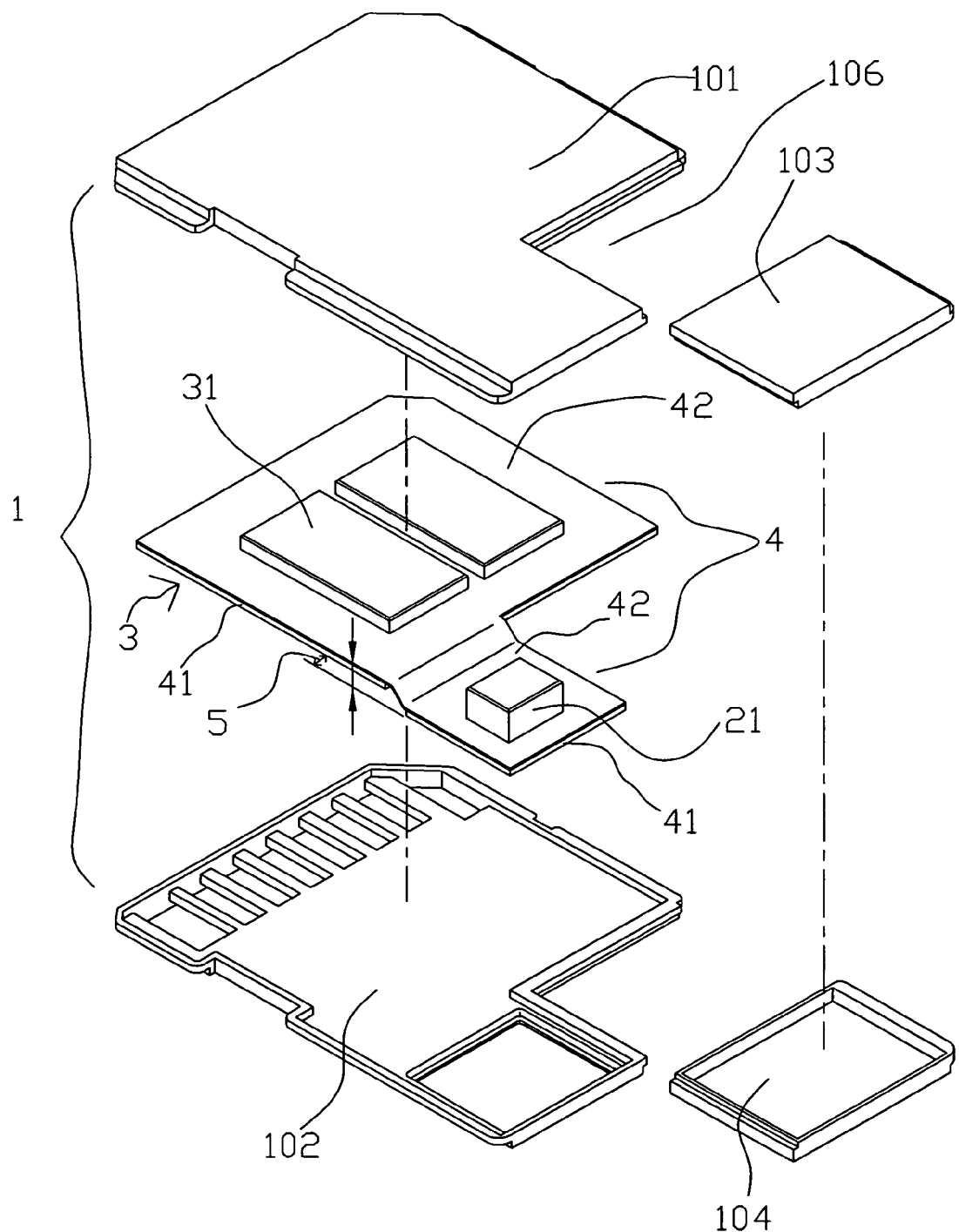
FIG. 3 is an exploded view of a preferred embodiment of the invention.

Refer to FIGS. 1 to 3 for the secure digital (SD) flash memory card according to a preferred embodiment of the present invention; however the people skilled in the art also can use a flash memory card of a different specification, such as the Compact Flash (CF) card, Smart Media (SM) card, and Memory Stick (MS) card. The SD memory card casing 1 comprises an upper casing 102, a lower casing 101, and a L-shape slot 106 formed on a lateral side of the casing 1, and the L-shape slot 106 (which could be installed separately on both sides) is connected separately to an upper side panel 104 and a lower side panel 103 to define a side panel 10. Further, the upper casing 102 and lower casing 101 are engaged with each other to pack a SD unit 3 (flash memory card unit) and a USB unit 2 therein to form a flash memory card capable of storing and protecting the SD unit 3 (flash memory card unit) and the USB unit 2 in the casing 1.

For simplicity, the exploded views of the present invention as shown in FIGS. 2 and 3 are expressed in an up-side-down form, wherein the SD unit 3 (flash memory card unit) includes a SD communication interface 32 (flash memory card communication interface) and a SD memory chip set 31 (flash memory card memory chip set), and the USB unit 2 includes a USB communication interface 22 and a SD processor chip 21. To comply with the USB specification, the actual thickness of the USB communication interface 22 is equal to 2.2 mm, and the SD communication interface 32 also complies with the requirement of the card reader having a specification of the SD memory card and comes with a thickness of 2.1 mm. Therefore, there exists a height difference of approximately 0.1 mm between the USB unit 2 and the SD unit 3. To meet the requirements of the two specifications, the present invention uses a rigid flexible board 4 for connecting the SD unit 3 and the USB unit 2. The rigid flexible board 4 comprises two rigid printed circuit board 41(PCB) (see FIG. 3) and a flexible printed circuit board 42 (FPC) thermally pressed and attached with each other, and said two rigid printed circuit board 41 are wholly thermally pressed and attached on said flexible printed circuit board 42 (see FIG. 3). The rigid printed circuit board 41 uses a prepreg (PP) as its substrate, and its surface is attached by a copper foil, and the SD communication interface 32 and the USB communication interface 22 are formed by the photolithography and etching processes, and the SD communication interface 32(flash memory card communication interface) and the USB communication interface 22 are disposed separately on the rigid printed circuit board 41. The flexible printed circuit board 42 uses a polyimide (PI) material as its laminate, and a copper foil is coated onto the surface of the laminate, and the electric circuit is formed by the photolithography and etching processes, and the SD processor chip 21 (processor chip) and the SD memory chip 31 (flash memory card memory chip set) are disposed on the flexible printed board 42 (see F*ig*.3).

Further, an end of the rigid flexible board 4 is electrically connected to the SD unit, and another end of the rigid flexible board 4 is electrically connected to the USB unit 2. Therefore, the height difference 0.1 mm between the communication interface 32 of the SD unit 3 and the communication interface 22 of the USB unit 2 can be overcome by bending the rigid flexible board 4, forming an offset 5 to meet the requirements of the SD and USB specifications. Compared with the prior art, the present invention maximizes the functions and the flexible, thin and light, and spatial wiring characteristics of the rigid flexible board 4 to eliminate the short-circuit phenomenon that causes the USB communication interface to crack or break, so as to enhance the longevity of the product.

Figure 4:
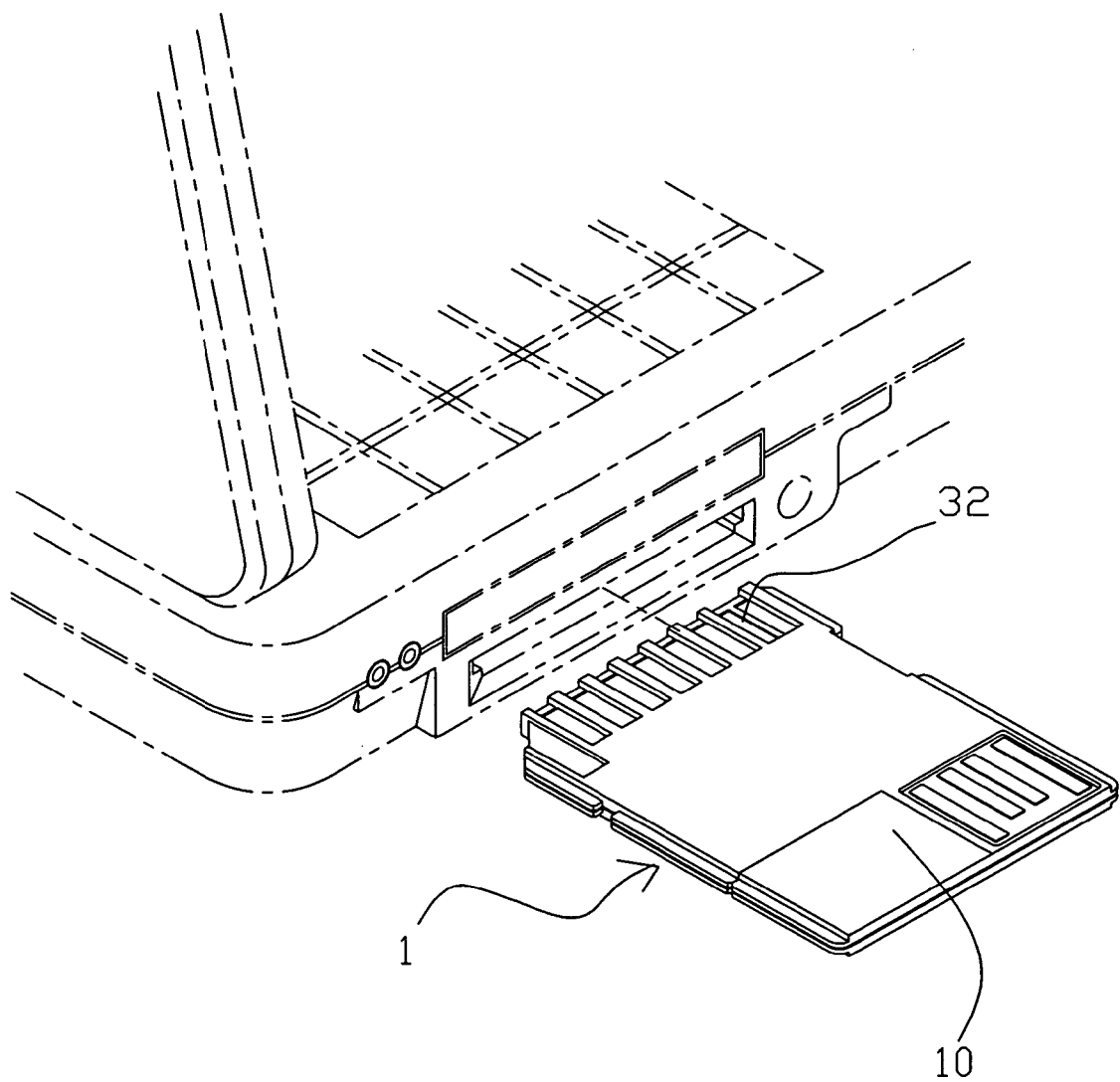
FIG. 4 is a schematic view of a first application of the invention.

Refer to FIG. 4 for the schematic view of a first application of a memory card having a USB communication interface according to the present invention. If the memory card having the USB communication interface of the invention uses the SD communication interface 32 to connect a notebook computer, the memory card having the USB communication interface will use a SD communication interface 32 to connect a corresponding SD card reading device of the notebook for transmitting data.

Figure 5:
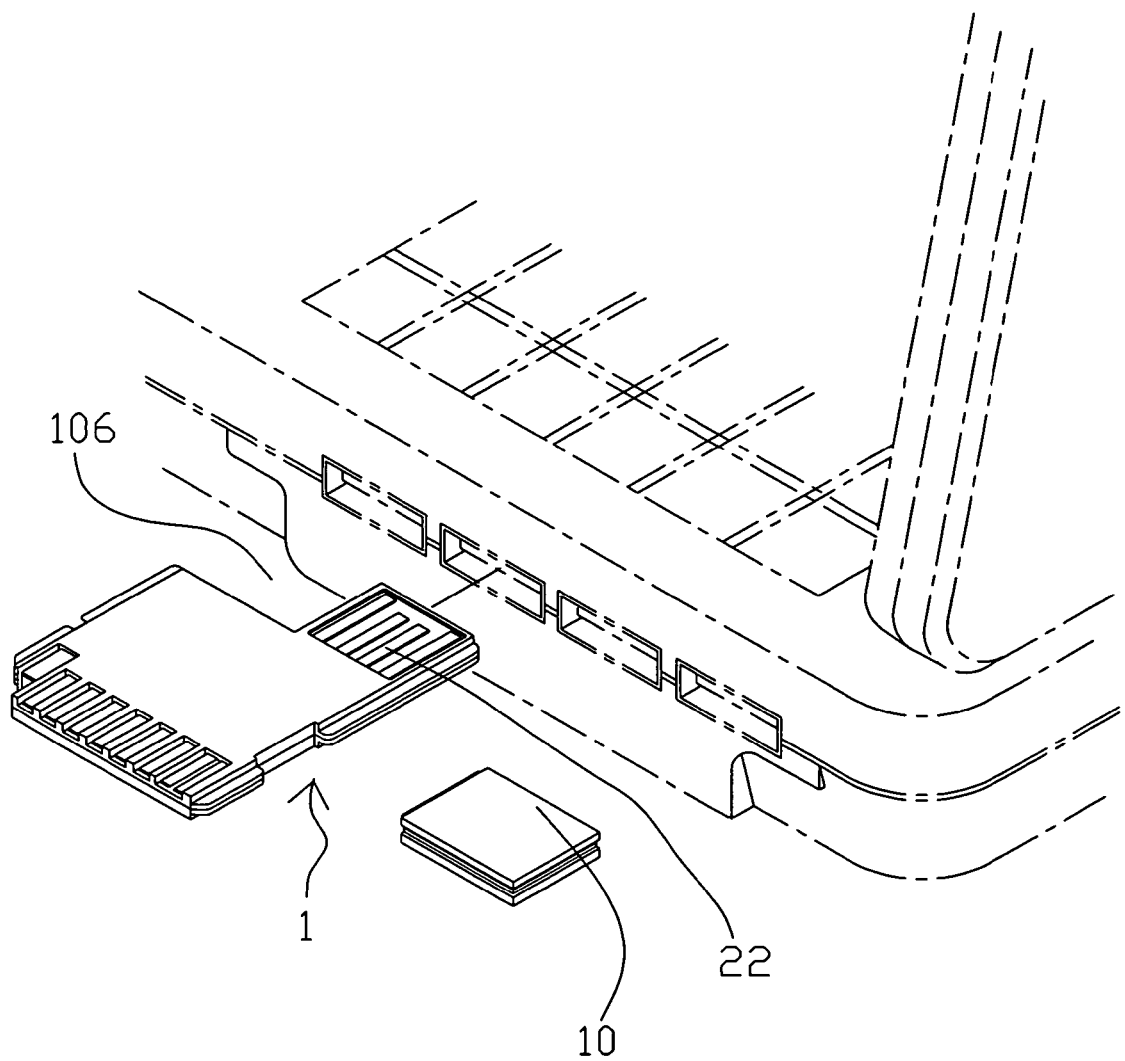
FIG. 5 is a schematic view of a second application of the invention.
Figure 6:
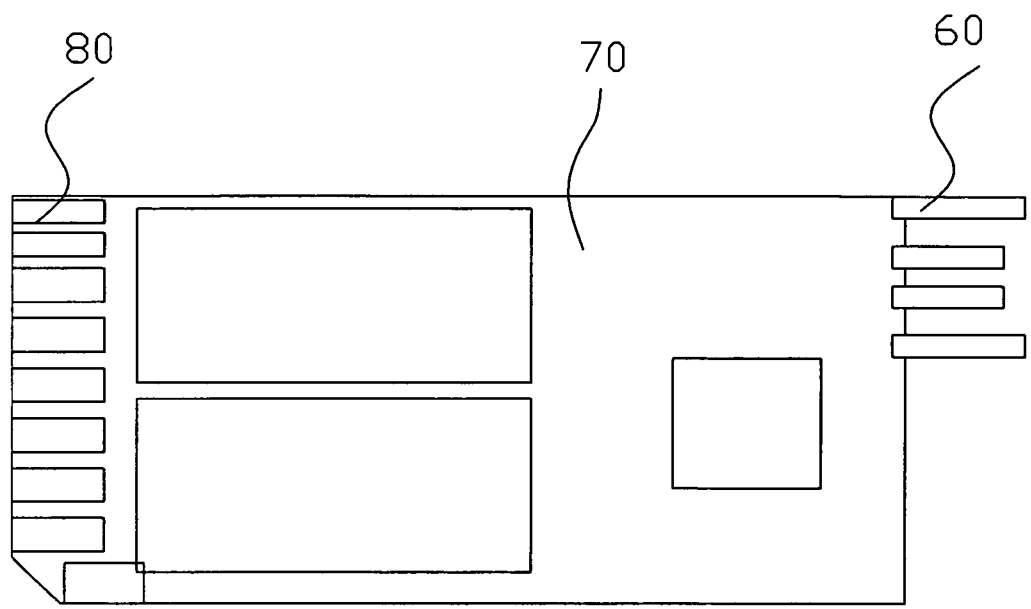
FIG. 6 is a schematic view of a prior art memory card having a SD communication interface and a USB communication interface.
Figure 6A:
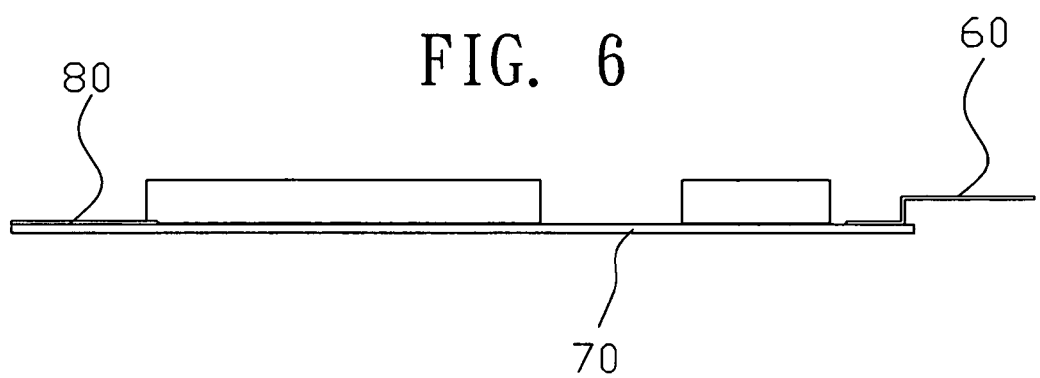
FIG. 6a is a cross-sectional view of a prior art memory card having a SD communication interface and a USB communication interface.

Refer to FIG. 5 for the schematic view of a second application of a memory card having a USB communication interface. If the memory card having the USB communication interface uses the USB communication interface 22 to connect a notebook computer, the memory card having the communication interface will use the USB communication interface 22 to connect a corresponding USB port for transmitting data. In the applications of the memory card, the side panel 10 is removed or turned to an angle to connect the USB communication interface 22 with the USB port of the computer device directly. As to the connection between the side panel 10 and the L-shape slot 106, they can be connected by embedding the side panel 10 into the L-shape slot 106. Alternatively, the L-shape slot 106 forms a pivotal connecting end on one of its sides for pivotally connecting the side panel 10, such that when the USB communication interface 22 is used, a user just needs to turn the side panel 10 to an angle to connect the USB port.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A flash memory card, being a structure that uses a rigid flexible board to connect a flash memory card unit and a universal serial bus unit, said flash memory card unit is disposed at an end of said flash memory card, said flash memory card unit comprises a flash memory card communication interface and a flash memory card memory chip set, and said universal serial bus unit is disposed at another end of said flash memory card, said universal serial bus unit comprises a universal serial bus communication interface and a processor chip, wherein a rigid flexible board is provided for connecting an electric signal between said flash memory card communication interface and said universal serial bus communication interface, and said rigid flexible board comprises two rigid printed circuit boards and a flexible printed circuit board thermally pressed and attached with each other, wherein said two rigid printed circuit boards are wholly thermally pressed and attached on said flexible printed circuit board, and said flash memory card communication interface and said universal serial bus communication interface are disposed on said rigid printed circuit boards, and said processor chip and said flash memory card memory chip set are disposed on said flexible printed circuit board, and a bending characteristic of said flexible printed circuit board is used to maintain a height difference between a planes of said flash memory card communication interface and said universal serial bus communication interface, so that said flash memory card is configured to concurrently have said universal serial bus communication interface and said flash memory card communication interface, and enhance the applicability of said flash memory card, wherein a side panel mounted adjacent to the universal serial bus unit is movable.

2. The flash memory card, being a structure that uses a rigid flexible board to connect a flash memory card unit and a universal serial bus unit of claim 1, wherein said flash memory card is a secure digital (SD) card.

3. The flash memory card, being a structure that uses a rigid flexible board to connect a flash memory card unit and a universal serial bus unit of claim 1, wherein said flash memory card is a compact flash (CF) card.

4. The flash memory card, being a structure that uses a rigid flexible board to connect a flash memory card unit and a universal serial bus unit of claim 1, wherein said flash memory card is a smart media (SM) card.

5. The flash memory card, being a structure that uses a rigid flexible board to connect a flash memory card unit and a universal serial bus unit of claim 1, wherein said flash memory card is a memory stick (MS) card.

6. The flash memory card of claim 1, wherein the two rigid printed circuit boards and the flexible printed circuit board are non-overlapping in the direction perpendicular to the planes of the boards.

7. The flash memory card of claim 1, wherein the rigid printed circuit board has a prepreg substrate and a surface covered by copper foil.

8. The flash memory card of claim 7, wherein the flexible printed circuit board is a polyimide material laminate with copper foil coated on a surface.

* * * * *